(12) United States Patent
Wu et al.

(10) Patent No.: US 7,596,017 B2
(45) Date of Patent: Sep. 29, 2009

(54) MAGNETIC RANDOM ACCESS MEMORY AND METHOD OF REDUCING CRITICAL CURRENT OF THE SAME

(75) Inventors: Te-Ho Wu, Douliou (TW); Alberto Canizo Cabrera, Douliou (TW); Lin-Hsiu Ye, Douliou (TW)

(73) Assignee: National Yunlin University of Science and Technology, Douliou, Yunlin County (TW)

( * ) Notice: Subject to any disclaimer, the term of this patent is extended or adjusted under 35 U.S.C. 154(b) by 255 days.

(21) Appl. No.: 11/679,827

(22) Filed: Feb. 27, 2007

(65) Prior Publication Data

US 2008/0205123 A1 Aug. 28, 2008

(51) Int. Cl.
*G11C 11/14* (2006.01)
(52) U.S. Cl. .................. 365/171; 365/158; 365/173; 977/933; 977/935
(58) Field of Classification Search .................. 365/171, 365/158, 173, 100, 66, 80, 83, 85; 257/421, 257/E21.665; 977/934, 935, 933; 438/3
See application file for complete search history.

(56) References Cited

U.S. PATENT DOCUMENTS

2002/0167059 A1* 11/2002 Nishimura et al. .......... 257/421
2005/0185455 A1* 8/2005 Huai ........................... 365/171
2006/0104110 A1* 5/2006 Sun et al. .................... 365/173

OTHER PUBLICATIONS

Spin angular momentum transfer in current-perpendicular nanomagnetic junctions, by J.Z. Sun, IBM J. Res. & Dev. vol. 50 No. 1 Jan. 2006, pp. 81-100.*

* cited by examiner

*Primary Examiner*—Richard Elms
*Assistant Examiner*—Harry W Byrne
(74) *Attorney, Agent, or Firm*—Pai Patent & Trademark Law Firm; Chao-Chang David Pai

(57) ABSTRACT

A magnetic random access memory includes a substrate, a free layer and a spacer layer. The substrate and the free layer are made of a vertical anisotropy ferrimagentic thin film. The spacer layer is sandwiched between the substrate and the free layer and is made of an insulating layer. The method uses a modified Landau-Lifshitz-Gilbert equation to obtain a critical current value as a function of exchange coupling constant. The critical current value is predictable under several external magnetic fields being applied. When the exchange coupling constant is proportionally varied, the critical current value is reduced to a third of its original value under an optimum state.

8 Claims, 5 Drawing Sheets

MAGNETIC RANDOM ACCESS MEMORY AND METHOD OF REDUCING CRITICAL CURRENT OF THE SAME

BACKGROUND

1. Field of the Invention

The present invention relates to a random access memory (MRAM). More particularly, the present invention relates to a magnetic random access memory with vertical anisotropy ferrimagnetic structure, and a method of reducing the critical current of the MRAM.

2. Description of Related Art

Magnetic random access memory (MRAM) is a non-volatile memory technology to store digital data. The conventional MRAMs use horizontal anisotropy magnetoresistance elements or cells to store data.

Refer to FIG. 1. A MRAM 100 in accordance with the prior art comprises a biasing layer 110, a pinned layer 120, a spacer layer 130 and a free layer 140. The biasing layer 110 is an anti-ferromagnetic layer to pin or secure the pinned layer 120 magnetization in a given direction. The pinned layer 120 and the free layer 140 are both ferromagnetic. The spacer layer 130 is made of non-magnetic materials or insulating materials.

Refer to FIG. 2. The magnetization 141 of the free layer 140 is parallel to the magnetization 121 of the pinned layer 121, and both of them point towards the same direction. In this circumstance, magnetic resistance of the MRAM 100 is at a low state. However, if the direction of the magnetization 141 of the free layer 140 is reversed relative to the direction of the magnetization 121 of the free layer 120 as denoted by numeral 141', in this circumstance, magnetic resistance of the MRAM 100 is at a high state.

Conventional method to change the directions of the magnetization 141,141' of the free layer 140 uses two quadrature currents passing through the MRAM 100. Accessing is accomplished by measuring the resulting currents of the quadrature currents through the MRAM 100. Therefore, each cell of the MRAM 100 must be kept in a given volume. Otherwise, the accessing currents will influence other cells neighboring the cell matrix of the MRAM 100. The conventional method that changes the directions of the magnetizations restricts density of the cells matrix, hence increases power consumption.

The problems that aforementioned MRAM 100 faced are inevitable under conditions in which the present magnetoresistance elements have a multi-layer structure with various materials. Therefore, there is a need to provide an improved MRAM and a method of reducing critical current of the MRAM to mitigate or obviate the aforementioned problems.

SUMMARY

An object of the present invention is to provide a magnetic random access memory comprising a substrate and a free layer made of a vertical anisotropy ferrimagnetic materials so as to avoid using the biasing layer, which reduces the volume of the entire magnetic random access memory.

Another object of the present invention is to provide a method using a modified Landau-Lifshitz-Gilbert equation to obtain a critical current value as a function of exchange coupling constant. The critical current value is predictable under several external magnetic fields being applied to reduce power consumption of the entire magnetic random access memory.

A magnetic random access memory comprises a substrate, a free layer and a spacer layer. The substrate and the free layer are made of vertical anisotropy ferrimagnetic materials and are respectively the bottom and the top of the magnetic random access memory. The substrate and the free layer have vertical anisotropy magnetizations. The magnetization of the free layer spins freely. The spacer layer is formed between the substrate and the free layer and made of an insulating material.

In an embodiment, the magnetization of the substrate has a fixed magnitude and is substantially perpendicular to the substrate, and the magnetization of the free layer is substantially perpendicular to the free layer. Each of the substrate and the free layer is a multi-layer thin film.

Spinning orientations of a spin-polarized current applied to the magnetic random access memory causes magnetization precession and switching in the free layer. Positive or negative spin-polarized current passing through the sandwiched structure of the magnetic random access memory represents respectively downward or upward directions of electrons flows.

A method of reducing a critical current in a magnetic random access memory comprises using a modified Landau-Lifshitz-Gilbert equation to produce a transitional equation describing a net magnetization of dynamics; calculating the net magnetization of dynamics by the transitional equation to produce a resulting equation under applying a spin-polarized current to the magnetic random access memory; inputting all boundary conditions of the magnetic random access memory with the resulting equation to obtain a critical current value; and reducing the critical current value by changing at least one of an included angle between net magnetic moments of the substrate and the free layer, a coupling constant, an anisotropy energy density, an absolute value between the magnetic moments of the substrate and the free layer, and an included angle among an external magnetic field and net magnetic moments of the substrate and the free layer.

In an embodiment, the modified Landau-Lifshitz-Gilbert equation comprises a plurality of effective parameters. The critical current value decreases responding to spin orientations of the spin-polarized current.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
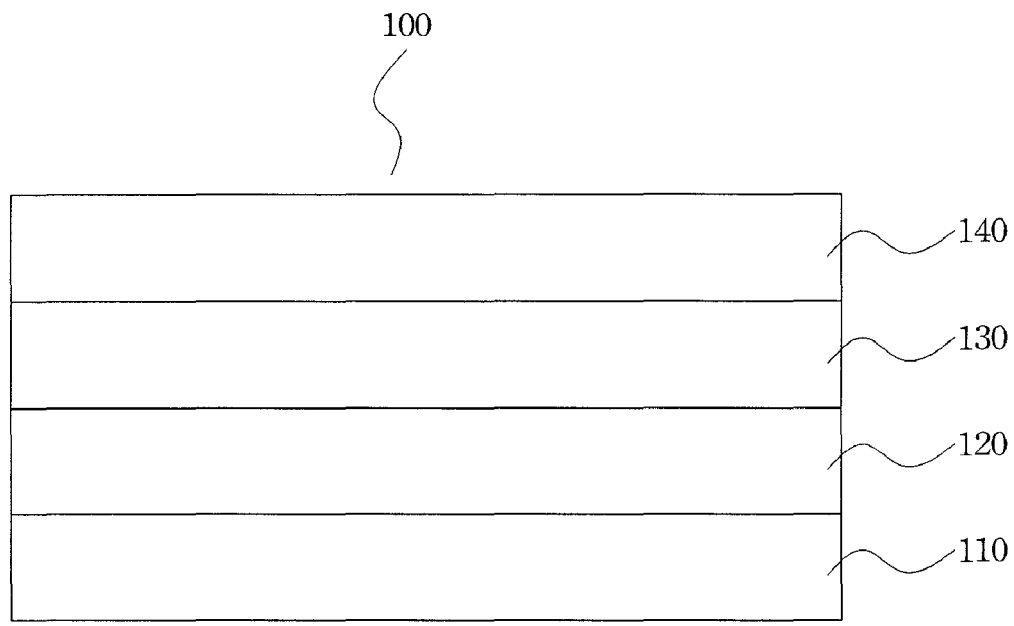
FIG. 1 is a schematic view of a MRAM in accordance with the prior art.
Figure 2:
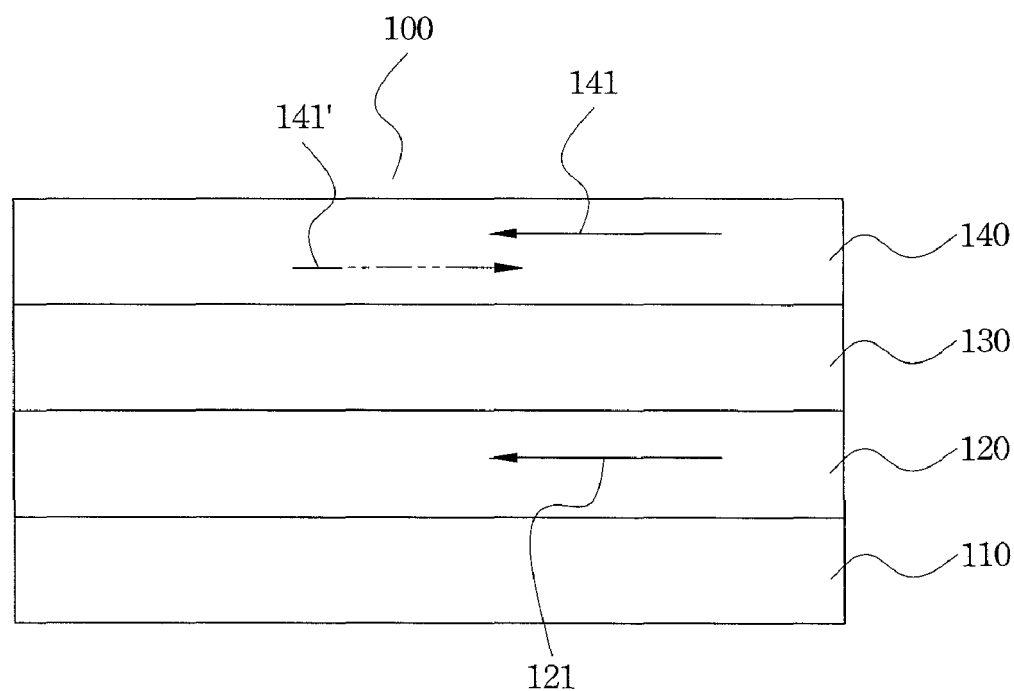
FIG. 2 is an operational, schematic view of the MRAM in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
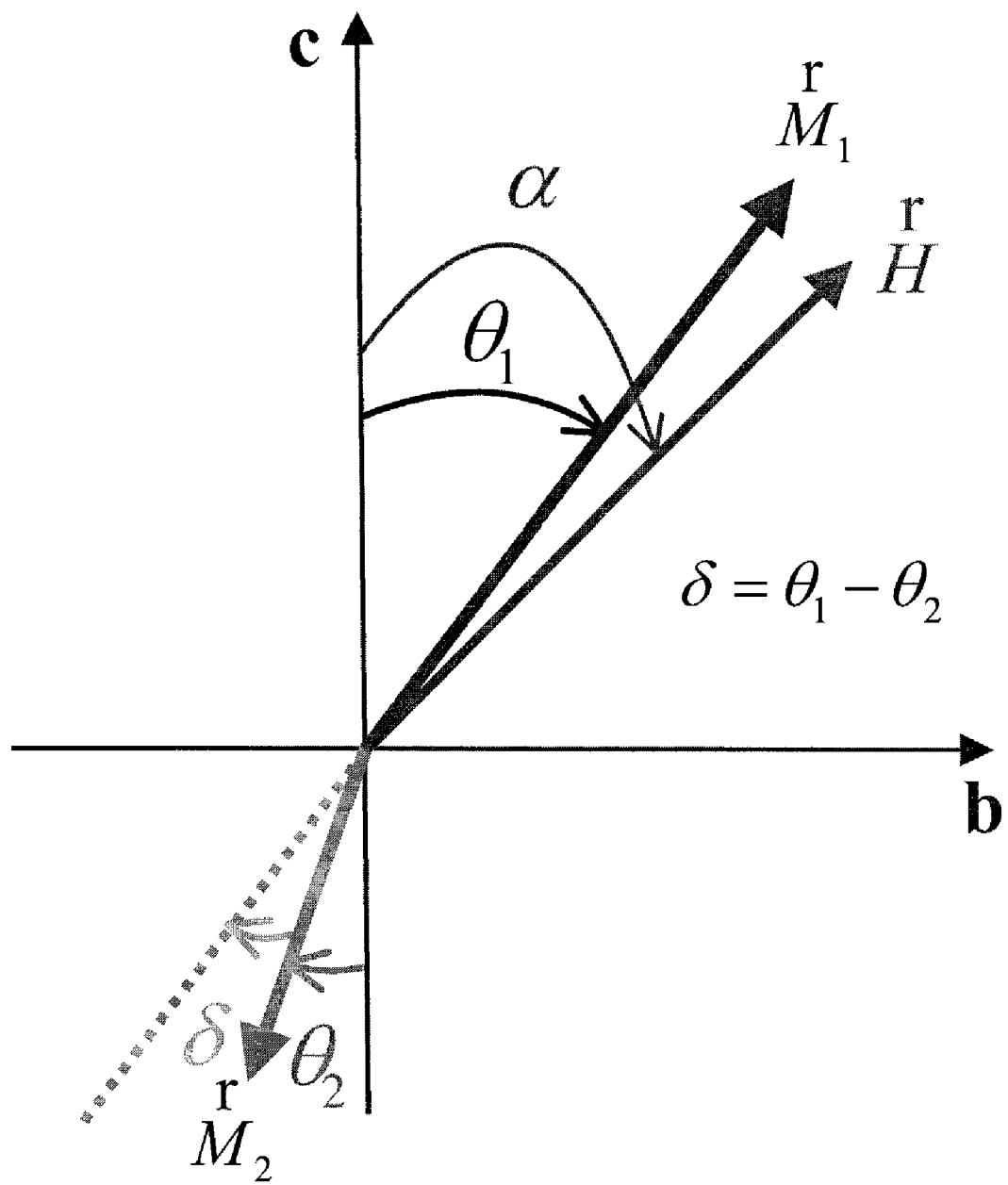
FIG. 3 is a schematic diagram of the relationship of magnetization vectors of a MRAM in accordance with the present invention.

Refer to FIG. 3. Considering a magnetic layer constituted by two subnetworks, where $M_1$ and $M_2$ represent respectively the magnetization vectors of each subnetwork, the total energy of the whole magnetic layer is written by equation (1) as $M_1$ is larger than $M_2$ ($M_1 > M_2$):

$$E_{tot} = -H[M_1 \cos(\alpha - \theta_1) - M_2 \cos(\alpha - \theta_2)] + \quad (1)$$
$$(K_1 \sin^2 \theta_1 + K_2 \sin^2 \theta_2) +$$
$$2\pi(M_1 + \cos\theta_1 - M_2 \cos\theta_2)^2 - \lambda M_1 M_2 \cos(\theta_1 - \theta_2),$$

where H is the magnitude of the applied magnetic field; $\alpha$, $\theta_1$ and $\theta_2$ describe the directions of the applied magnetic field and each of the subnetwork magnetization vectors, respectively. The first three terms in equation (1) correspond to the external energy density, anisotropy energy density and demagnetizing energy density, respectively. The last term corresponds to the exchange coupling energy density that exists between the two subnetworks. The constant $\lambda$ is the exchange coupling constant (a dimensionless quantity in the cgs unit system) which characterizes the canting strength.

The solutions of $\theta_1$ and $\theta_2$ for equation (1) are $$\theta_1 = \frac{H\sin\alpha(\lambda M_S + 2K_2/M_2 - H\cos\alpha)}{\lambda(2K_1 + 2K_2 - 4\pi M_S^2 + HM_S\cos\alpha) +}, \quad (2)$$
$$(2K_2/M_2 - H\cos\alpha + 4\pi M_S)$$
$$(2K_1/M_1 + H\cos\alpha - 4\pi M_S)$$

$$\theta_2 = \frac{H\sin\alpha(\lambda M_S - 2K_1/M_1 - H\cos\alpha)}{\lambda(2K_1 + 2K_2 - 4\pi M_S^2 + HM_S\cos\alpha) +},$$
$$(2K_2/M_2 - H\cos\alpha + 4\pi M_S)$$
$$(2K_1/M_1 + H\cos\alpha - 4\pi M_S)$$

where $K_1$ and $K_2$ are the respective intrinsic magnetic anisotropy energy constants for each subnetwork, and $M_s = |M_1 - M_2|$. Equation (2) is restricted for the particular case when $M_1 > M_2$. For the case when $M_1 < M_2$, the solutions can easily be found by interchanging 1 by 2 in the subscripts. It is worth mentioning that above $\theta_1$ and $\theta_2$ were solved for the minimal energy state.

Embodiment

Figure 4:
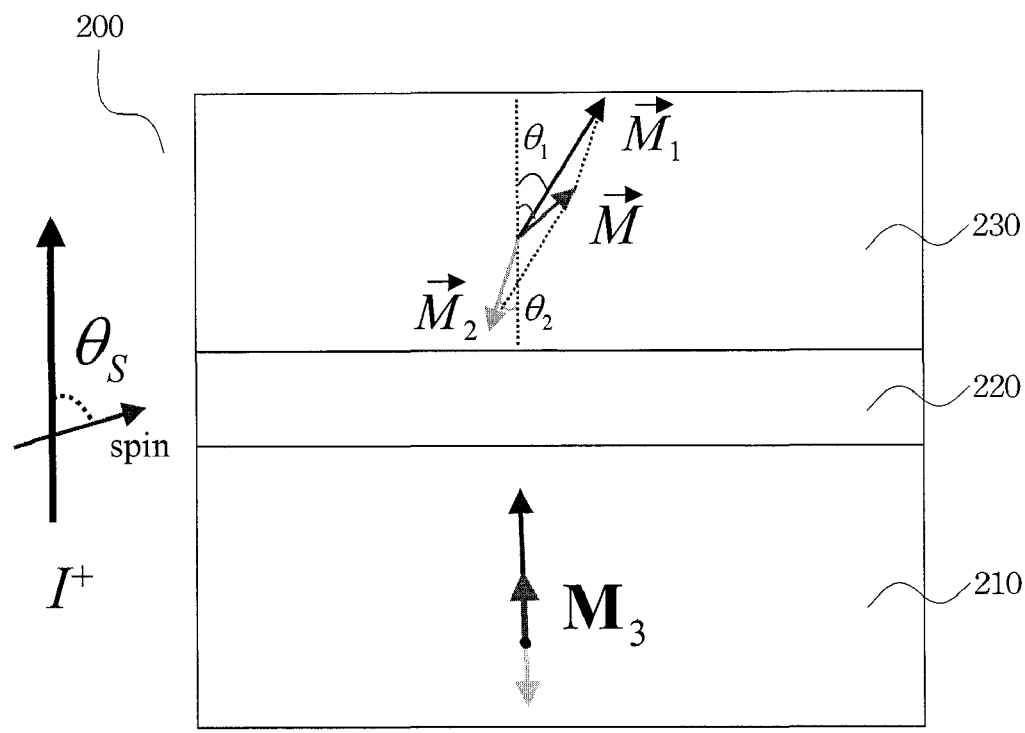
FIG. 4 is a schematic view of a MRAM in accordance with the present invention with the relationship of magnetization vectors in FIG. 3.
Figure 5:
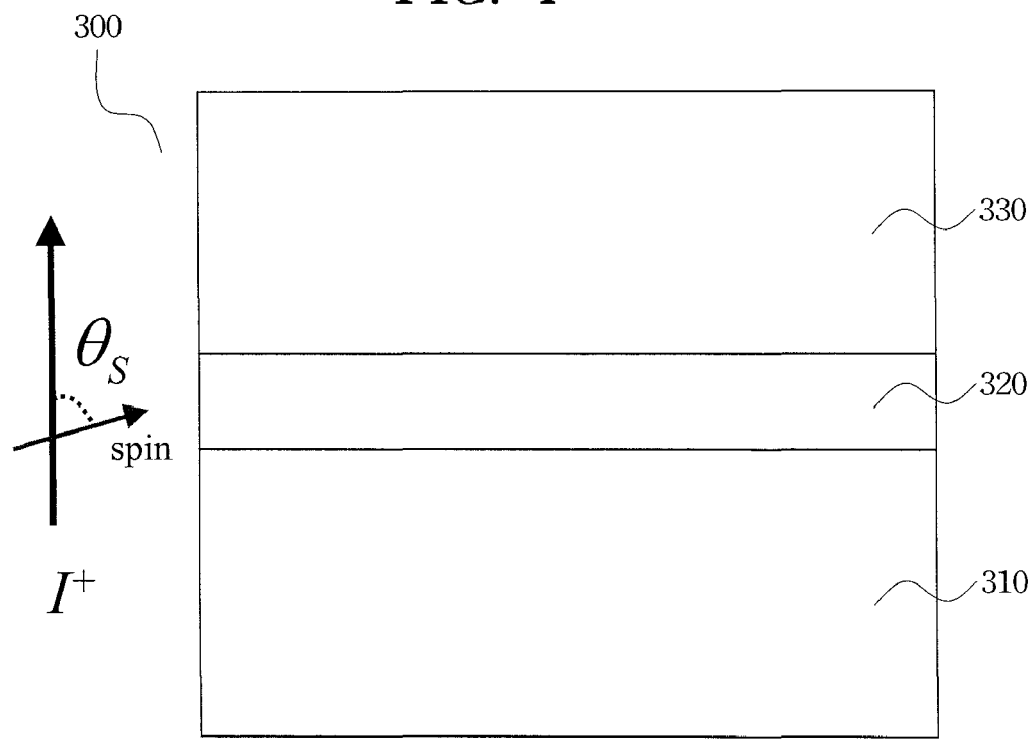
FIG. 5 is an operational, schematic view of the MRAM in FIG. 4 when a positive current is applied.

Refer to FIG. 4 and FIG. 5. An embodiment of a MRAM 200 in accordance with the present invention comprises a substrate 210, a spacer layer 220 and a free layer 230.

The substrate 210 is the bottom layer of the MRAM 200 and is made of vertical anisotropy ferrimagnetic materials. In this embodiment, the ferrimagnetic materials comprise Terbium-Iron-Cobalt (TbFeCo), Gadolinium-Iron-Cobalt (GdFeCo), Dysprosium-Iron-Cobalt (DyFeCo). The spacer layer 220 is a thin film made of insulating materials.

The free layer 230 is the top layer of the MRAM 200 and is made of vertical anisotropy ferrimagnetic materials. In this embodiment, the ferrimagnetic materials comprise Terbium-Iron-Cobalt (TbFeCo), Gadolinium-Iron-Cobalt (GdFeCo), Dysprosium-Iron-Cobalt (DyFeCo).

The spacer layer 220 separates the substrate 210 and the free layer 230 to configure a multi-layer sandwiched structure (tri-layer in this embodiment). Each of the magnetic layers including the substrate 210 and the free layer 230 is considered as composed by two magnetic subnetworks, as previously described. The subnetworks of the free layer 230 possess magnetizations that form a canting angle. On the other hand, two strongly coupled antiparallel magnetic subnetworks of the substrate 210 are embedded. The total magnetic moments for the subnetworks, are defined as M and $M_3$, respectively, and are obtained by simple vector sum of their respective subnetwork magnetic moments. An included angle between the total magnetic moment M and the total magnetic moment $M_3$ is less than 180 degrees.

A positive/negative current I is applied through the sandwiched structure. By positive current (as denoted by sing "+"), which means the electrons flow from the free layer 230 to the substrate 210. If the net magnetization vector $M_3$ of the second magnetic layer (the substrate 210) is kept fixed all the time as the current I is applied, then the Landau-Lifshitz-Gilbert (LLG) equation for the total magnetization M of the first magnetic layer (the free layer 230) is given by $$\dot{\mu} = \gamma_{eff} \mu \times H_{eff} - \alpha_{eff} \mu \times \dot{\mu} \pm \alpha_{Ieff}^{\pm} \mu \times \mu \times \mu_3. \quad (3)$$

where $$\gamma_{eff} = \frac{M_1 - M_2}{M_1/\gamma_1 - M_2/\gamma_2}, \quad (4)$$

$$\alpha_{eff} = \frac{\alpha_1 M_1/\gamma_1 + \alpha_2 M_2/\gamma_2}{M_1/\gamma_1 - M_2/\gamma_2}, \quad (5)$$

$$a_{Ieff}^{\pm} = I \frac{\hbar}{eV} \frac{(C_1 g_1^{\pm} + C_2 g_2^{\pm})}{(M_1/\gamma_1 - M_2/\gamma_2)}, \quad (6)$$

$$H_{eff} = H + 4\pi M(\mu_3 \square \mu)\mu_3 + \frac{2K_u}{M}(\mu_3 \square \mu)\mu_3. \quad (7)$$

wherein $\gamma_i$ and $\alpha_i$ (i=1, 2) are the gyromagnetic ratios and the damping parameters, respectively, for the corresponding subnetwork of the free layer 230; $\mu_3$ is the unit vector for the net magnetization in the substrate 210; $K_u = K_1 + K_2$; V is the volume of the free layer 230; $g^{\pm}_{1,2}$ are the coefficients for each of the two subnetworks, which depend on the polarization of the electrons. The signs used as superscript correspond to a positive applied current ($I^+$) or to a negative applied current ($I^-$). Moreover, $$C_{1,2} = 1 + 2(1 \pm \cos\theta_{1,2})/(3 \pm \cos\theta_{1,2}), \quad (8)$$

where $\theta_{1,2}$ are the angles obtained in equation (2), which depend on the magnetization orientation of each subnetwork.

Let $\mu_3 = c$. Assuming that the unit vector $\mu$ of net magnetization of the free layer 230 has the form $$\mu = a\sin\theta'\cos\omega t - b(\cos\theta'\sin\phi - \sin\theta'\cos\phi\sin\omega t) + \quad (9)$$
$$c(\cos\theta'\cos\phi + \sin\theta'\sin\phi\sin\omega t),$$

that a weak effective damping is present, and that $|\dot{\theta}'| \ll \omega$. Then, the expression for the time variation of $\theta'$ from equation (3) is approximately given by $$\left\langle \frac{d\theta'}{dt} \right\rangle = \pm(a^\pm_{I_{eff}}\cos\phi - \omega\alpha_{eff})\sin\theta', \quad (10)$$

where < . . . > denotes the time-averaged value in one period, φ is the angle between the c axis and $H_{eff}$, and θ' is the angle between M and $H_{eff}$. From equation (3), if there is an absence of damping and torque effects, M will gyrate (with an angular frequency $\omega=\gamma_{eff}H_{eff}$) around $H_{eff}$, making an angle θ'. Although $\theta_1$ y $\theta_2$ must change (since $M=M_1+M_2$ is time dependent in the LLG equation), it is being restricted to the case when the angle δ (the difference between $\theta_1$ and $\theta_2$) is constant. Under these restrictions, viewing the net magnetization to characterize the magnetic layer as a whole can be used. Otherwise, the individual magnetizations at each sub-network within the magnetic layers 210,230 must be considered.

Considering now a net magnetization M nearly parallel to the $H_{eff}$ axis, that is θ'≈0, this "alignment" will be preserved for applied currents I above the upper critical value $I_c^+$, that is, for $I>I_c^+$. Similarly, when the net magnetization M is nearly antiparallel to the $H_{eff}$ axis, i.e. θ'≈π, the "alignment" of M will be preserved as long as the applied current is below its lower critical value $I_c^-$, that is $I<I_c^-$. The critical current values are given by $$I_C^\pm = \frac{eV}{\hbar} \frac{(M_1/\gamma_1 + M_2/\gamma_2)}{(C_1 g_1^\pm + C_2 g_2^\pm)} \frac{\alpha_{eff}\omega}{\cos\phi}, \quad (11)$$

Note that the individual parameters of each subnetwork, the effective parameters, as well the angle φ are included in equation (11). The angle φ is also included in equation (11) since the critical current values are obtained when the switching of M has not taken place, i.e., when M is nearly parallel or antiparallel to $H_{eff}$. The angle φ, however, must be changed during the switching process. The critical currents $I_c^+$ and $I_c^-$ are calculated by employing standard parameters and assuming a 60×130 nm² elliptic sample. One of the key parameters in the canting model is the coupling constant λ, which characterizes the strength of the canting. In this embodiment of the present invention, a variety of values are assigned to the coupling constant, arbitrarily ranging from 0 to 1000. Using each of the values of λ in this range, the corresponding critical currents are calculated, keeping fixed the external magnetic field.

Figure 6:
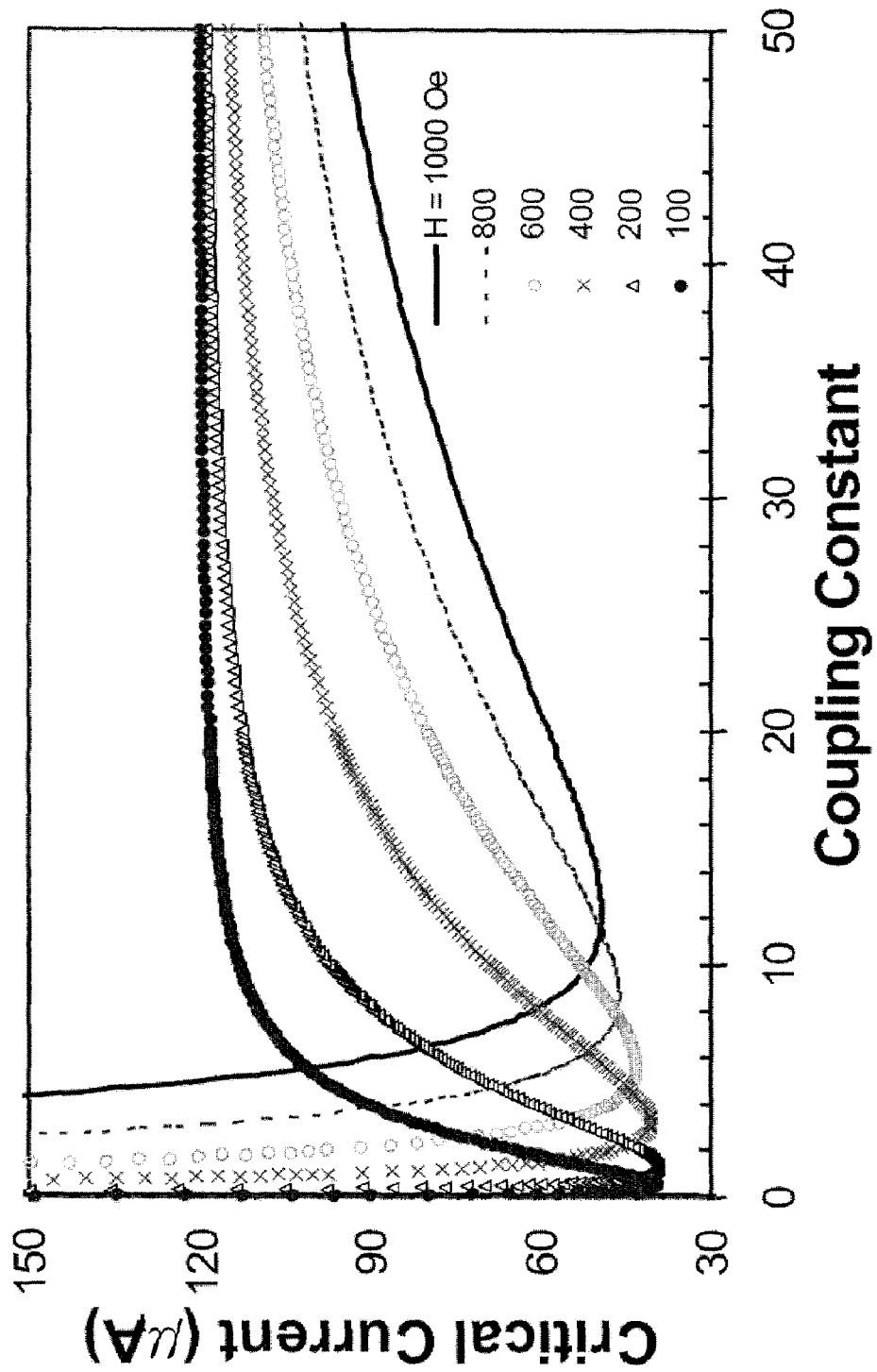
FIG. 6 is a diagram illustrating a relationship between critical current and coupling constant.

Refer to FIG. 6. The calculated positive critical current $I_c^+$ is a function of the coupling constant (in a range from 0 to 50) for several fixed magnetic fields. The critical current approaches to a constant value (around 120 μA) when large coupling constant values are used. In this region, for a fixed λ, the critical current increases as the magnetic field decreases. This result is reversed at the region where small coupling constant values are used, that is, when the strength of the coupling is weak. In this region, the critical current drastically increases as the coupling constant decreases, and, for a fixed λ, the critical current decreases faster when the magnetic field is decreased.

Another result shown in FIG. 6 is that the critical current as a function of the coupling constant at a fixed magnetic field shows a minimum. This minimum, however, is shifted as the magnetic field strength varies. Furthermore, the critical current value for each minimum in FIG. 6 also varies as the magnetic field changes.

Figure 7:
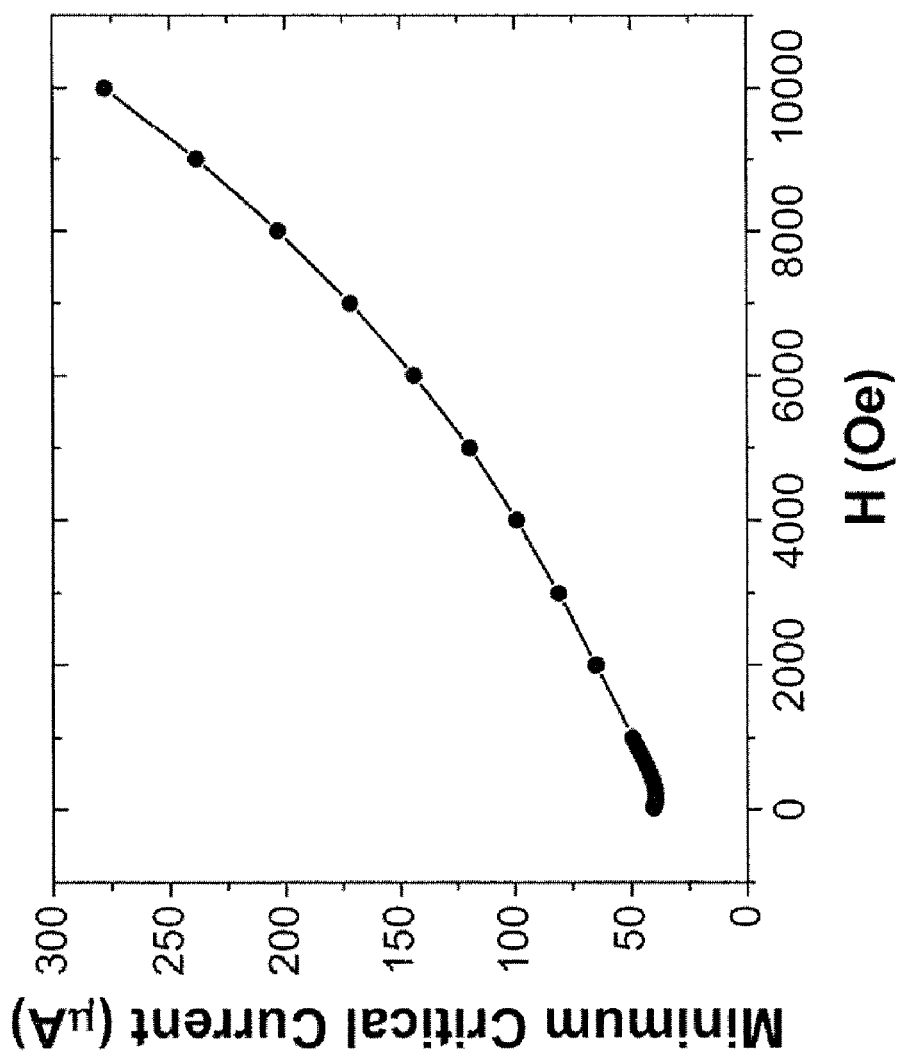
FIG. 7 is a diagram illustrating a relationship of minimum values of the critical current as a function of applied magnetic field.

Refer to FIG. 7. FIG. 7 shows those minimum critical current values as a function of the magnetic field strength. The profile so obtained also shows a minimum value at 190±10 Oe. This value for the magnetic field strength, therefore, represents the minima in FIG. 6, and corresponds to the smallest value for the critical current, 39.58±0.01 μA. This represents a reduction in the critical current to a third of the value obtained when large coupling constants are used.

A study for the spin-polarized switching current on the net magnetization for magnetic materials containing two subnetworks is disclosed. The modified LLG equation was used to produce quantitative predictions for the critical current as a function of the exchange coupling constant at several applied magnetic fields.

The embodiment of the present invention has several advantages as follows.

First, the structure of the embodiment in accordance with the present invention has less layers than the conventional structure of MRAM, the manufacturing yield and the manufacturing cost have been improved.

Second, since both the substrate 210 and the free layer 230 are made of vertical anisotropy ferrimagnetic materials, this feature decreases the volume of the entire MRAM.

Third, the power consumption of the MRAM in accordance with the present is reduced by reducing efficiently the critical currents.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic random access memory comprising
    a substrate made of a vertical anisotropy ferrimagnetic thin film and having a first and a second magnetic subnetworks, wherein the first and the second magnetic subnetworks form a first magnetic moment;
    a free layer made of a vertical anisotropy ferrimagnetic thin film and having a third and a fourth magnetic subnetworks, wherein the third and the fourth magnetic subnetworks form a second magnetic moment, and the included angle between the first magnetic moment and the second magnetic moment is less than 180 degrees; and
    a spacer layer formed between the substrate and the free layer and made of an insulating material.

2. The magnetic random access memory as claimed in claim 1, wherein the vertical anisotropy ferrimagnetic thin film of each of the substrate and the free layer is selected from the group consisting of Terbium-Iron-Cobalt (TbFeCo), Gadolinium-Iron-Cobalt (GdFeCo), Dysprosium-Iron-Cobalt (DyFeCo), and Co/Pd multilayer thin film.

3. The magnetic random access memory as claimed in claim 1, wherein each of the substrate and the free layer is a perpendicularly anisotropic ferrimagnetic thin film having one or more layers.

4. The magnetic random access memory as claimed in claim 2, wherein each of the substrate and the free layer is a perpendicularly anisotropic ferrimagnetic thin film having one or more layers.

5. The magnetic random access memory as claimed in claim 1, wherein the third and the fourth magnetic subnetworks form a canting angle.

6. The magnetic random access memory as claimed in claim 2, wherein the third and the fourth magnetic subnetworks form a canting angle.

7. The magnetic random access memory as claimed in claim 1, wherein the first and the second subnetworks are two strongly coupled antiparallel magnetic subnetworks.

8. The magnetic random access memory as claimed in claim 2, wherein the first and the second subnetworks are two strongly coupled antiparallel magnetic subnetworks.

* * * * *